(12) United States Patent
Shaw et al.

(10) Patent No.: US 11,821,950 B2
(45) Date of Patent: Nov. 21, 2023

(54) SWITCH ASSEMBLY WITH SEPARATE INDEPENDENT FAULT DETECTION

(71) Applicant: Allison Transmission, Inc., Indianapolis, IN (US)

(72) Inventors: James D. Shaw, Carmel, IN (US); Aaron Ransdell, Brownsburg, IN (US)

(73) Assignee: Allison Transmission, Inc., Indianapolis, IN (US)

( * ) Notice: Subject to any disclaimer, the term of this patent is extended or adjusted under 35 U.S.C. 154(b) by 175 days.

(21) Appl. No.: 17/445,209

(22) Filed: Aug. 17, 2021

(65) Prior Publication Data

US 2023/0055956 A1  Feb. 23, 2023

(51) Int. Cl.
*G01R 31/327* (2006.01)

(52) U.S. Cl.
CPC ................. *G01R 31/3277* (2013.01)

(58) Field of Classification Search
CPC .............. G01R 31/327; G01R 31/3277; G01R 31/3278; G01R 31/333; G01R 31/013; G01R 31/2829; G01R 1/06794; H01H 2001/0021; H01H 2001/0042; H01H 2001/0063; H01H 1/34; H01H 1/48; H01H 1/50; H01H 2001/506; H01H 31/14
See application file for complete search history.

(56) References Cited

U.S. PATENT DOCUMENTS

| | | | |
|---|---|---|---|
| 4,626,708 A | 12/1986 | Cooper | |
| 7,783,009 B2 | 8/2010 | Bielski et al. | |
| 8,093,525 B2 | 1/2012 | Altmann | |
| 8,957,684 B2 | 2/2015 | Heise et al. | |
| 9,559,689 B2 | 1/2017 | Adkins et al. | |
| 2015/0316932 A1* | 11/2015 | Kim | G01R 31/3277 700/275 |
| 2016/0268079 A1* | 9/2016 | Kim | H01H 47/001 |
| 2022/0115857 A1* | 4/2022 | Zhou | H02H 9/041 |

FOREIGN PATENT DOCUMENTS

| | | | |
|---|---|---|---|
| CA | 2919608 A1 * | 2/2014 | ............. G01D 5/142 |
| DE | 4213131 C2 | 11/1995 | |

* cited by examiner

*Primary Examiner* — Son T Le
(74) *Attorney, Agent, or Firm* — Woodard Emhardt Henry Reeves & Wagner LLP

(57) ABSTRACT

A switching assembly configured to use different sensing technologies to detect a button press and to thereby determine when the switch is malfunctioning. The switch assembly may include an actuator that is configured to selectively open or close an electric circuit, and may also include a sensor responsive to the position of the actuator. A logic circuit may be included that is configured to compare input from the sensor with input from the circuit the switch is electrically connected to so as to determine whether the switch assembly is operating properly. The logic circuit may generate a signal indicating the operational status of the switch and may optionally provide this signal to a fault detection circuit. The actuator, sensor, and logic circuit may also be mounted within a common housing thus providing a single installation package.

15 Claims, 5 Drawing Sheets

SWITCH ASSEMBLY WITH SEPARATE INDEPENDENT FAULT DETECTION

BACKGROUND

The present disclosure generally relates to a system for determining when a switch has failed. Common approaches to this problem include using a single approach to closing the switch and detecting a failure. For example, multiple switch contacts may be employed, some of which provide confirmation that the switch is closed or open. This can improve functional safety and reliability, but it is often the case that if a malfunction occurs, it effects all of the contacts thus making it difficult or impossible to detect the failure. For example, when using multiple contacts, the same liquid intrusion that is causing a short in a single set of contacts may also short all contacts.

SUMMARY

Disclosed are examples of switching assemblies configured to use different sensing technologies to detect a switch malfunction based on a single user action. In one aspect, a switch assembly may include an actuator that is configured to close an electric circuit when in a closed position, and to open the electric circuit when in an open position. The assembly may also include a sensor responsive to the position of the actuator, and optionally a logic circuit configured to compare input from the sensor with input from the electric circuit the switch assembly is electrically connected to so as to determine whether the switch assembly is operating properly. In another aspect, the actuator, sensor, and logic circuit are optionally mounted to a common housing thus providing a single package unit that may be installed as a switch.

In another aspect, the logic circuit may be configured to generate a fault signal when inputs from the sensor and electric circuit do not match. In another aspect, the sensor is optionally responsive to changes in inductance, capacitance, reluctance, or any combination thereof, caused by moving the actuator from the open to the closed position. In another aspect, the actuator may include a protrusion, and the protrusion may be arranged and configured to pass adjacent to the sensor when the actuator changes position. In another aspect, the protrusion is optionally configured to interrupt a beam of electromagnetic energy when the actuator changes position, and the sensor may be configured to detect the interruption.

In another example, a switching assembly as disclosed herein may include an actuator coupled to one or more contacts and the actuator may be configured to move the contacts from an open position to a closed position. The contacts may be electrically connected to an electric circuit and may be arranged and configured to open the electric circuit in the open position, and to close the electric circuit in the closed position. The switching assembly may include a sensor responsive to the position of the actuator, and a separate logic circuit electrically connected to the sensor and the electric circuit. The logic circuit may be configured to compare input from the sensor indicating the position of the actuator with voltage or current of the electric circuit.

In another aspect, the logic circuit may generate and send a fault signal when inputs from the sensor and actuator do not match. In another aspect, the sensor may be responsive to changes in inductance, capacitance, eddy currents, and/or light rays, caused by a change in the position of the actuator. In another aspect, the actuator, sensor, and logic circuit may be mounted within a housing, and the housing may optionally be hermetically sealed reduce or eliminate intrusion of foreign material. In another aspect, the actuator and sensor are arranged and configured such that a single action of the actuator causes the sensor to detect movement and the circuit to be closed.

In another example, switching assembly as disclosed herein may include multiple contacts configured to move between an open position and a closed position, and an actuator arranged and configured to move the contacts between the open and closed positions. The assembly may also include a sensor responsive to the position of the actuator, and the sensor may be configured to send a signal indicating the closed position of the contacts when the actuator changes position. A logic circuit may be included that is optionally configured to compare input from an electric circuit and the sensor, where the multiple contacts are electrically connected to the electric circuit, and the logic circuit is configured to generate and/or send a fault signal to a fault detection circuit when inputs from the sensor and the electric circuit do not match. In another aspect, the sensor is optionally responsive to changes in inductance, capacitance, eddy currents, and/or light rays. In another aspect, actuator, sensor, and logic circuit are optionally mounted to a common housing that may be hermetically sealed.

In another aspect, the actuator may include a protrusion, and the protrusion may be configured to interrupt a beam of electromagnetic energy directed toward the sensor when the actuator changes position, and the sensor may be configured to detect the interruption and interpreted as movement. In another aspect, the switch assembly may include a biasing element arranged and configured to automatically return the actuator to an open position from a closed position, such as in the case of a momentary switch. In another aspect, the actuator may be configured to remain in the closed position until moved to the open position, such as in the case where no biasing element is present.

Further forms, objects, features, aspects, benefits, advantages, and embodiments of the present invention will become apparent from a detailed description and drawings provided herewith.

DETAILED DESCRIPTION

Figure 1:
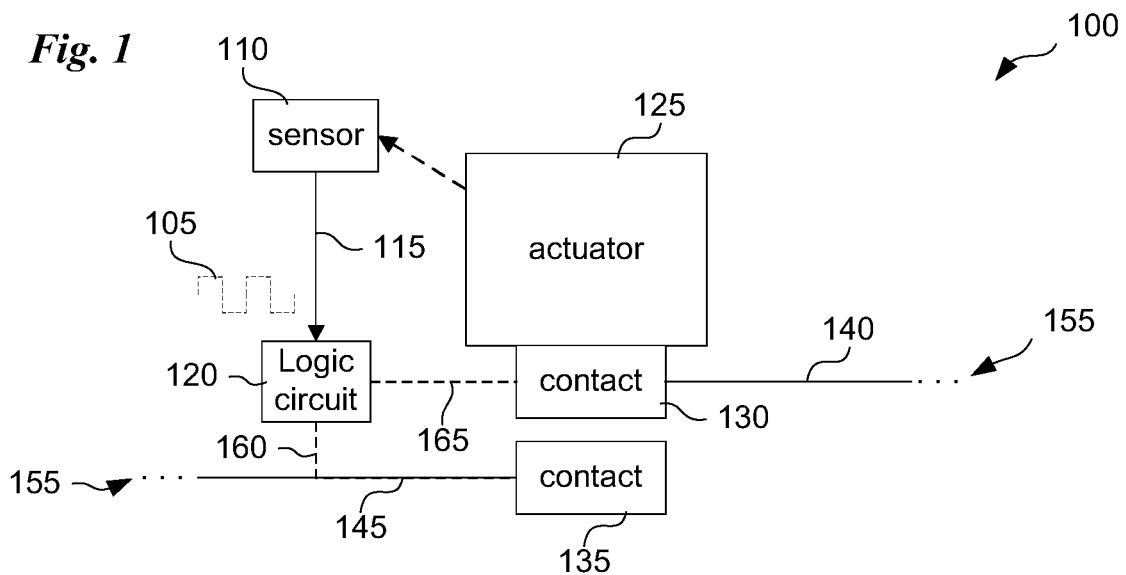
FIG. 1 is a component diagram illustrating one example of a switch assembly of the present disclosure.
Figure 2:
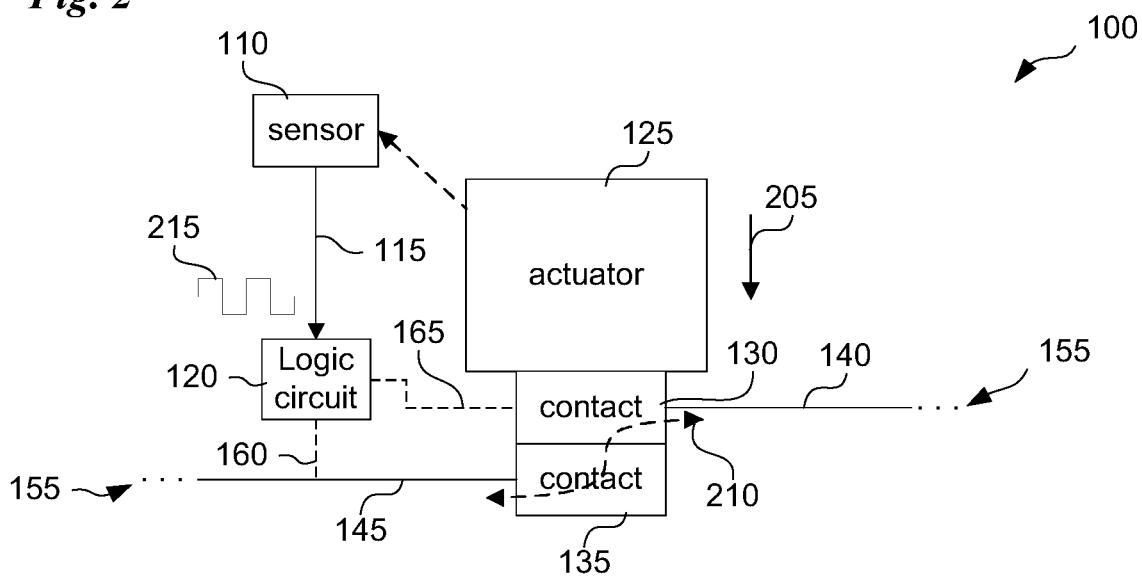
FIG. 2 is a component diagram illustrating the switch assembly of FIG. 1 in a closed position.

Illustrated at 100 in FIGS. 1 and 2 is one example of a switch assembly according to the present disclosure. Switch assembly 100 includes an actuator 125 coupled to one or more contacts illustrated here as contact 130 and contact 135. Actuator 125 may be configured to move in the direction of movement 205 from an open position where contact 130 and contact 135 are not in contact as shown in FIG. 1, to a closed position shown in FIG. 2 where contact 130 and contact 135 are in contact. Contacts 130 and 135 are electrically connected to an electric circuit 155, and may be configured to complete the circuit when in the closed position. In this example, circuit lead 140 is electrically connected to contact 130, and circuit lead 145 is electrically connected to contact 135.

The switch assembly may also include a sensor 110. Sensor 110 may generate an open switch signal 105 which may be provided to logic circuit 120 thus providing input indicating that actuator 125 is in an open position. Sensor 110 is responsive to the position of actuator 125 such that sensor 110 is arranged and configured to generate open switch signal 105 when the actuator 125 is in the open position, and a closed switch signal 215 when the actuator 125 is in the closed position. In the closed position shown in FIG. 2, contacts 130 and 135 may be arranged and configured to provide a current path 210 through electric circuit 155. Thus actuator 125 may be configured to complete electric circuit 155 when actuated in the direction of movement 205.

In another aspect, sensor 110 may be electrically connected to a logic circuit 120 by a sensor lead 115. Logic circuit 120 is optionally electrically connected to electric circuit 155, with electric circuit 155 providing input to logic circuit 120. The logic circuit is optionally configured to compare input from sensor 110 indicating the open or closed position of actuator 125 with input from the electric circuit 155. This input from electric circuit 155 may include the current passing through electric circuit 155, the voltage on electric circuit 155 with respect to a common ground, or any combination thereof. Logic circuit 120 may optionally be separately electrically connected to electric circuit 155, contact 130 and/or contact 135 in more than one location. For example, an optional input lead 160 electrically connected to one side of electric circuit 155, and an optional input lead 165 may be electrically connected to the other side of electric circuit 155. This is one example of how the switch assembly may separately evaluate voltage and/or current of electric circuit 155 at multiple locations with respect to each other, or to ground.

Figure 3:
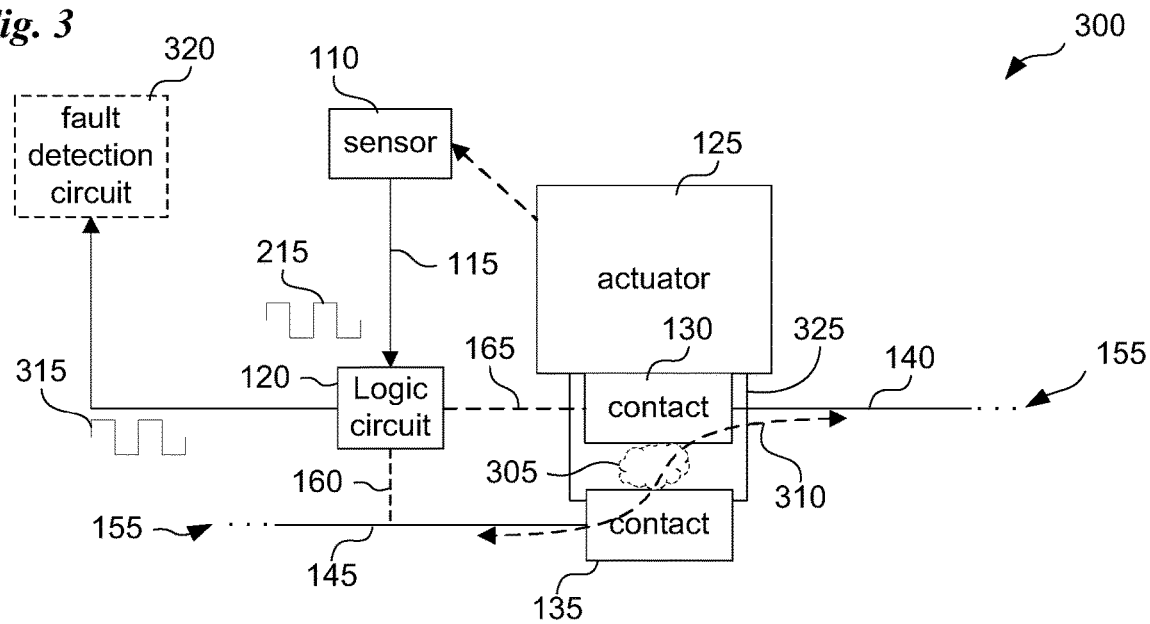
FIG. 3 is a component diagram illustrating another example of a switch assembly of the present disclosure that is like the switch assembly of FIGS. 1 and 2.

Illustrated in FIG. 3 at 300 is another example of a switch assembly like those shown in FIGS. 1 and 2, and illustrating optional features that may be included in the switch assembly of the present disclosure. In FIG. 3, logic circuit 120 may optionally send an output signal 315 to a fault detection circuit 320 indicating that the switch assembly is functioning properly, or has failed. The fault detection circuit 320 may be included as part of the disclosed switch assembly, or included in a separate system or circuit tasked with monitoring, reporting, or fault detection functionality.

For example, logic circuit 120 may include circuits comparing aspects of electric circuit 155 such as current and voltage to determine whether the switch assembly is malfunctioning. For example, when current 310 is at or below a low threshold, and actuator 125 is in the open position, logic circuit 120 may determine that the position of actuator 125 matches the state of electric circuit 155. In this example, actuator 125 has not been acted on leaving contact 130 and contact 135 physically separated and electric circuit 155 in an open or incomplete state. Thus actuator 125 gives the appearance or expectation that electric circuit 155 is open because actuator 125 has not been acted on (e.g. the button has not been "pressed" or moved). Logic circuit 120 may send a positive output signal 315 to a fault detection circuit 320 indicating switch assembly 300 is functioning properly. In this scenario, output signal 315 may be thought of as a "ready" signal indicating that the switch assembly is operational and ready for use. This ready signal is optional, however, and in some configurations, such a ready signal may be deemed unnecessary, and it may be advantageous to only send a signal if the switch assembly malfunctions. For example, to conserve power, the logic circuit 120 may not be activated to send output signal 315 unless actuator 125 is manipulated. In another example, logic circuit 120 may send output signal 315 for a predetermined period of time, and may then cease sending output signal 315 thereafter to conserve power, reduce signal processing overhead, and the like.

In yet another example, current flowing through electric circuit 155 may be greater than the low threshold with actuator 125 in the closed position (illustrated in FIG. 2), and logic circuit 120 may rightly determine that the position of actuator 125 matches the state of electric circuit 155. In this scenario, actuator 125 has been acted on (e.g. the button has been pressed, or a post moved) leaving contact 130 and contact 135 in contact and electric circuit 155 in a closed or completed state. Thus actuator 125 gives the appearance or expectation that electric circuit 155 is closed, or at least was closed briefly, and logic circuit 120 confirms this to be the case. As a result, logic circuit 120 may optionally send a positive output signal 315 to fault detection circuit 320 indicating switch assembly 300 is functioning properly.

In this scenario, output signal 315 may be a "momentary" signal that is sent only for the brief period of time actuator 125 is pressed. For example, the switch assembly may include a bias element 325 such that contact 130 and contact 135 are held apart unless actuator 125 is pressed and held in place until released. Thus output signal 315 may only be sent by logic circuit 120 to fault detection circuit 320 while the actuator 125 is being physically manipulated. In another aspect, output signal 315 may be a "steady on" signal that is sent after actuator 125 has returned to an open position. Logic circuit 120 may be configured to continue sending output signal 315 after actuator 125 has been physically manipulated, released, and returned to the open position (as shown in FIG. 1). As mentioned above, this "steady on" signal is optional as it may consume additional power, or have other side effects that may not be advantageous.

In another aspect, the switch assembly may be free of any biasing elements such that contact 130 and contact 135 are held together after manipulation, such as in the case of a sliding switch that moves from a first open position, to a second closed position, and is configured to remain in the closed position until physically manipulated to return to the open position. For example, a positive output signal 315 may be sent continuously after actuator 125 has been physically manipulated to the closed position thus indicating that the position of actuator 125 and the voltage and/or current characteristics of electric circuit 155 match. In another example, logic circuit 120 may send output signal 315 for a predetermined period of time, and may then cease sending output signal 315 thereafter.

In another example, the position of actuator 125 and the current and/or voltage of electric circuit 155 may not match while 125 is in the closed position. Logic circuit 120 may determine that this is the case, a situation which may occur where the switch assembly 100 has been actuated (e.g. button has been pressed or moved) thus giving the appearance and/or expectation that electric circuit 155 is (or was) closed, but in fact this is not the case. Such a situation may arise, for example, when actuator 125 is broken, misaligned, separated from contacts 130, 135, or is otherwise failing to physically complete electric circuit 155. As a result, logic circuit 120 may optionally send a negative or fault output signal 315 to fault detection circuit 320 indicating switch assembly 300 is not functioning properly. As mentioned above, this signal may be sent continuously, or for a brief period of time to indicate a malfunction has occurred in the switch assembly.

In another example illustrated in FIG. 3, current flowing through electric circuit 155 may be greater than the low threshold while actuator 125 is in the open position because foreign object 305 is present between contact 130 and contact 135. In this situation, foreign object 305 such as water, conductive or partially conductive particles, or other debris has infiltrated switch assembly 300 causing at least a small amount of current to flow through electric circuit 155 along current path 310 when it should not be. Logic circuit 120 may determine this by comparing the position of actuator 125 with current through electric circuit 155 along current path 310. When the actuator 125 is open, and the current through electric circuit 155 is above the low threshold, output signal 315 may be a negative or fault signal.

In any of the preceding examples discussed herein, logic circuit 120 is optionally configured to measure the voltage with respect to ground at contact 130 or contact 135. Logic circuit 120 may also be optionally configured to compare the voltage across contacts 130 and 135. Other voltage measurements may be taken as well and may be compared to high or low thresholds stored in a memory of logic circuit 120 and may be used to indicate a conductive path through electric circuit 155 is present when it should be (resulting in a positive output signal 315), is not present when it should not be (resulting in a positive output signal 315), is present when it should not be (resulting in a negative or fault output signal 315), or is not present when it should be (resulting in a negative or fault output signal 315).

As discussed above, the low voltage and low current thresholds may be retained in logic circuit 120. For example, the low current threshold may be less than 1 micro amp, less than 0.5 milliamps, less than 1 milliamp, less than 10 milliamps, less than 1 amp, or any other suitable amount. Similarly, a low voltage threshold may be may be less than 1 microvolt, less than 0.5 millivolts, less than 1 millivolt, less than 10 millivolts, less than 1 volt, less than 120 volts, or any other suitable amount. These thresholds may also be adjustable by coupling a separate computing device to the switch and applying updates to the control logic in logic circuit 120.

Figure 4:
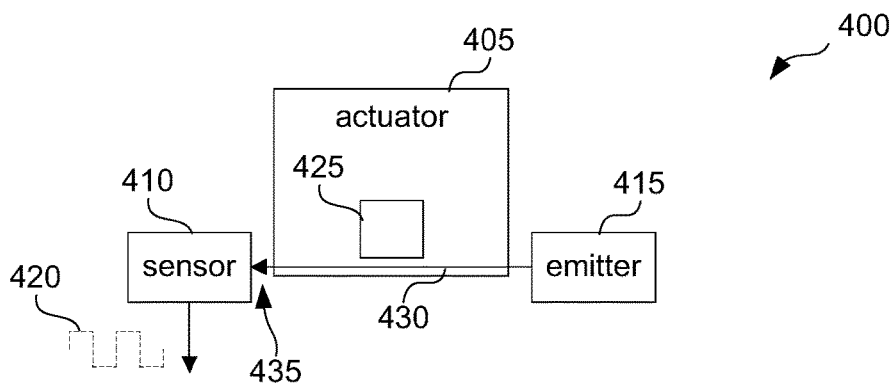
FIG. 4 is a component diagram illustrating a contactless position sensor that may be included in the switch assemblies of the preceding figures.
Figure 5:
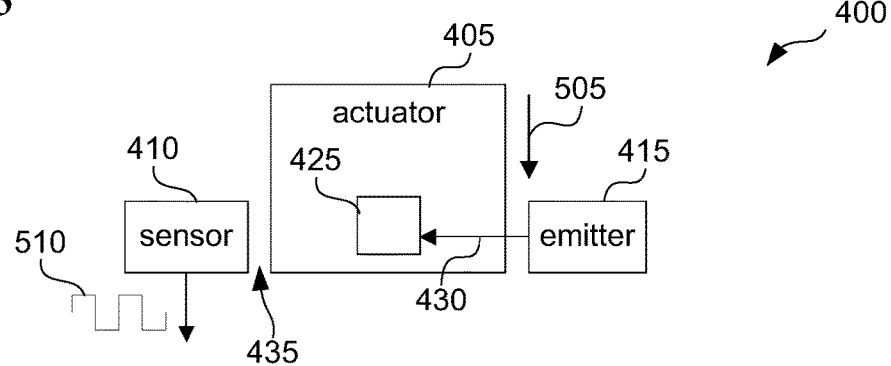
FIG. 5 is a component diagram illustrating the contactless position sensor of FIG. 4 in the closed position.

FIGS. 4-7 illustrate different optional contactless sensing aspects that may be included in any of the disclosed examples of a switch assembly. FIGS. 4 and 5 illustrate an example of using rays of electromagnetic energy to indicate when the switch assembly is being manipulated. A sensor aspect is illustrated at 400 where an actuator 405 optionally includes a protrusion 425 which extends outwardly away from actuator 405. An emitter 415 may be included emitting a beam of electromagnetic energy 430 toward a sensor 410. When actuator 405 is in the "open" position as shown in FIG. 4, an optional open switch signal 420 may be generated periodically or continuously by sensor 410 indicating that the switch assembly 400 is not being acted on to move actuator 405.

The protrusion 425 is arranged and configured to intercept a beam of electromagnetic energy 430 when in the closed position shown in FIG. 5. When actuator 405 is moved as indicated by direction of movement 505, protrusion 425 crosses between emitter 415 and sensor 410 thus intercepting electromagnetic energy 430. The sensor 410 may optionally generate a closed switch signal 510 that is different than open switch signal 420 indicating that the switch assembly is being acted on. In one example, the electromagnetic energy 430 is visible light. In another example, the electromagnetic energy 430 is infra-red or ultraviolet light. In another example, the electromagnetic energy 430 is laser light, either visible or invisible. Any suitable electromagnetic energy may be used irrespective of wavelength.

As illustrated, sensor 410 and actuator 405 are separated by open space 435 thus providing one example of contactless position sensing as it may be used in the disclosed switch assembly. This approach to contactless positional detection may be used for any of the disclosed switch assemblies where it is advantageous to do so.

Figure 6:
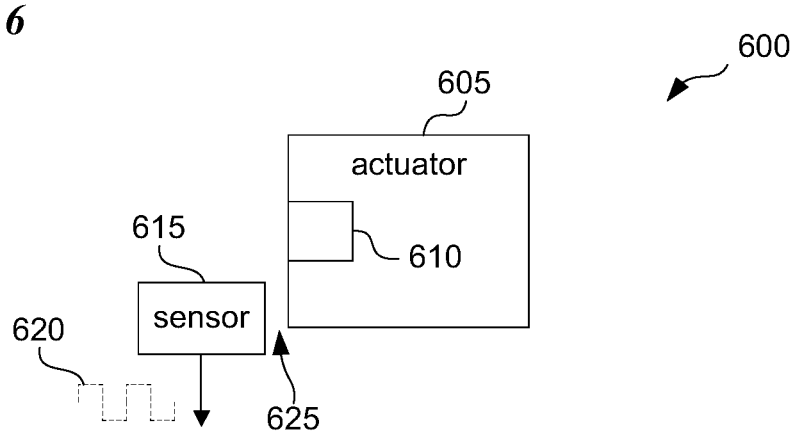
FIG. 6 is a component diagram illustrating a contactless position sensor that may be included in the switch assemblies of FIGS. 1-3.
Figure 7:
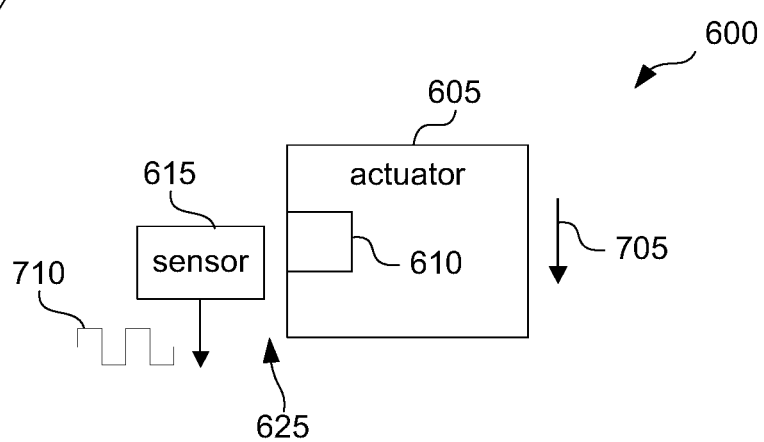
FIG. 7 is a component diagram illustrating the contactless position sensor of FIG. 6 in the closed position.

FIGS. 6 and 7 illustrate examples of contactless position sensing without using rays of electromagnetic energy to indicate when the switch assembly is being manipulated. A sensor aspect is illustrated at 600 where an actuator 605 optionally includes a sensor element 610 which may be included within actuator 605, may extend outwardly away from actuator 605, or any combination thereof. When actuator 605 is in the "open" position as shown in FIG. 6, an optional open switch signal 620 may be generated periodically or continuously by sensor 615 indicating that the switch assembly 600 is not being acted on to move actuator 605.

When actuator 605 is moved as indicated by direction of movement 705 in FIG. 7 to the closed position, sensor element 610 passes adjacent sensor 615, and thus sensor 615 may optionally generate a closed switch signal 710 that is different than open switch signal 620 indicating that the switch assembly is being acted on. As illustrated, sensor 615 and actuator 605 are separated by open space 625 thus providing another example of contactless position sensing as it may be used in the disclosed switch assembly.

In another example, sensor 615 may be a capacitive displacement sensor, and sensor element 610 optionally includes a metallic substance. As actuator 605 is moved along the direction of movement 705 and sensor element 610 passes adjacent sensor 615, the dielectric properties of open space 625 near sensor 615 change. This change can occur regardless of whether a metallic substance is present in sensor element 610, and it will result in a change in capacitance that may be detected by sensor 615 and reported as closed switch signal 710.

In another example, sensor 615 may be an inductive position sensor, and sensor element 610 may include a metallic target. As actuator 605 is moved along the direction of movement 705 and sensor element 610 passes adjacent sensor 615, a flow of current in sensor 615 is affected by the reluctance of sensor element 610. This results in a change in inductance that may be detected by sensor 615 and reported as closed switch signal 710.

Any of the foregoing approaches to contactless positional detection may be used for any of the disclosed switch assemblies where it is advantageous to do so. Any suitable contactless positional detection approach may be used.

Figure 8:
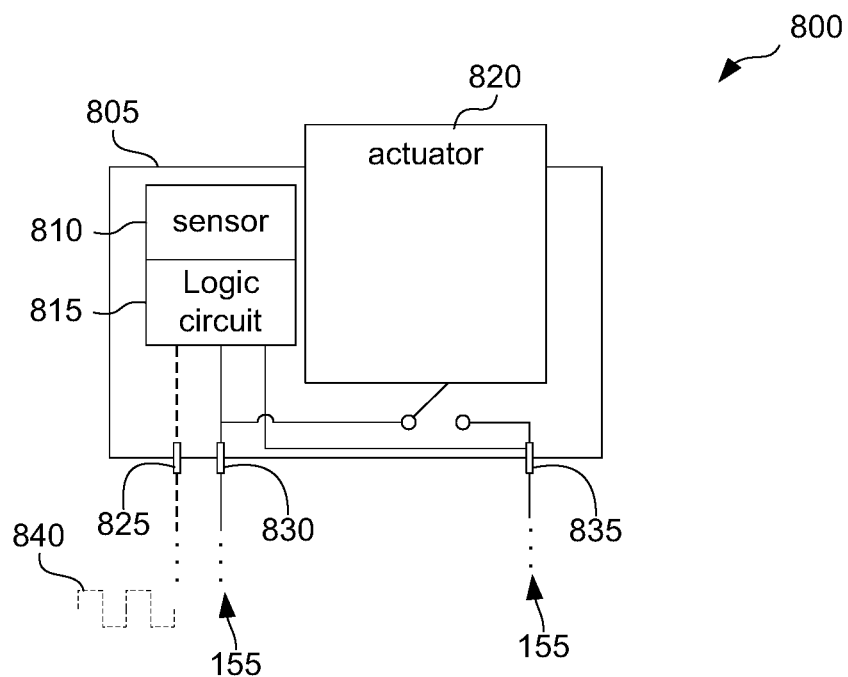
FIG. 8 is a component diagram illustrating another example of a switch assembly of the present disclosure like the assemblies shown in FIGS. 1-3.
Figure 9:
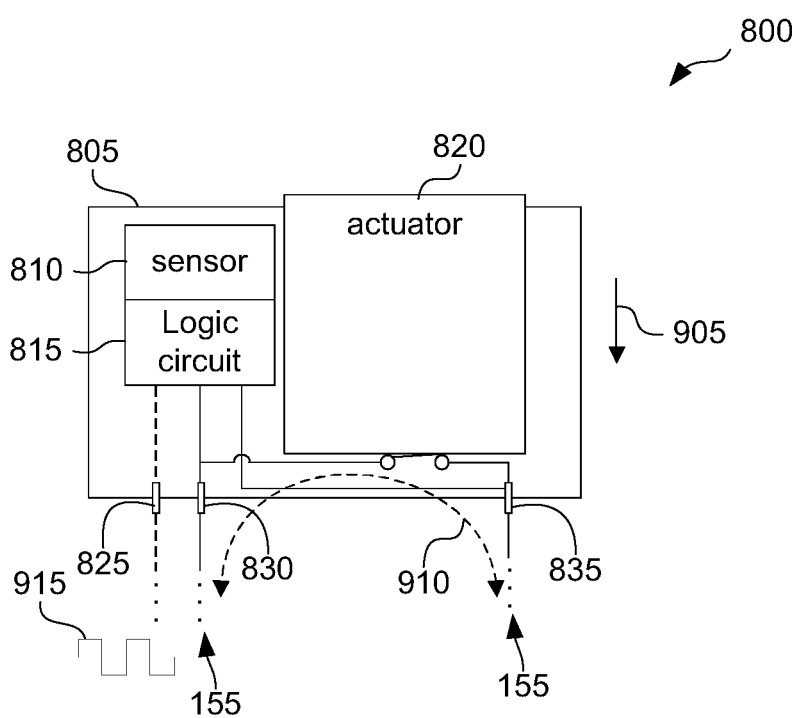
FIG. 9 is a component diagram illustrating the switch assembly of FIG. 8 in a closed position.

Illustrated at 800 in FIGS. 8 and 9 is another example of a switch assembly according to the present disclosure. Switch assembly 800 includes an actuator 820 arranged and configured to move in direction of movement 905 to close electric circuit 155 when in a closed position shown in FIG. 9, and to open electric circuit 155 when in an open position as shown in FIG. 8. Switch assembly 800 may also include a sensor 810 responsive to the position of actuator 820 which may be configured to generate a signal indicating that actuator 820 is changing, or has changed, position. Sensor 810 is thus responsive to the position of actuator 820 such that sensor 810 is arranged and configured to generate a signal when the actuator 820 is in the open position, and optionally a different signal when the actuator 820 is in the closed position.

The switch assembly 800 may also include a logic circuit 815 configured to compare input from the sensor 810 with input from the electric circuit 155 to determine that the switch assembly is operating properly. For example, the logic circuit 815 may be configured to generate a positive or negative open switch signal 840 and/or a positive or negative closed switch signal 915. These positive or negative output signals from logic circuit 815 may be used by other circuits (e.g. optional fault detection circuit 320) to determine and indicate either that the switch assembly 800 is operating properly, or that a malfunction has occurred as disclosed herein elsewhere.

In another aspect, switch assembly 800 optionally includes a housing 805, and the actuator 820, sensor 810, and logic circuit 815 may be mounted to housing 805 thus creating a switch assembly 800 in a single "package" which may be advantageous for easy installation and maintenance. In another aspect, actuator 820, sensor 810, and logic circuit 815 may be mounted inside housing 805. In another aspect, housing 805 may be hermetically sealed to reduce or eliminate the opportunity for foreign material to affect the performance of switch assembly 800. The electric circuit 155 may be electrically connected to switch assembly 800 by a power terminal 835 and a power terminal 830 thus providing the opportunity for switch assembly 800 to open or close electric circuit 155. The switch assembly 800 may also include an optional signal terminal 825 so that other diagnostic or monitoring circuits may be coupled to signals 840 and 915 of switch assembly 800. Such diagnostic equipment may include, but not be limited to, the fault detection circuit 320 shown in FIG. 3.

As shown in FIG. 9, when the actuator 820 is manipulated to move in the direction of movement 905, electric circuit 155 is completed or closed allowing for current path current path 910. As disclosed herein elsewhere, logic circuit 815 is configured to evaluate whether switch assembly 800 is malfunctioning by comparing input from electric circuit 155 and input from sensor 810. Also, any suitable sensing approach may be used by sensor 810 to detect movement of actuator 820. Such sensing may be accomplished using a contactless approach as discussed above with respect to FIGS. 4-7, examples of which are illustrated further below.

Figure 10:
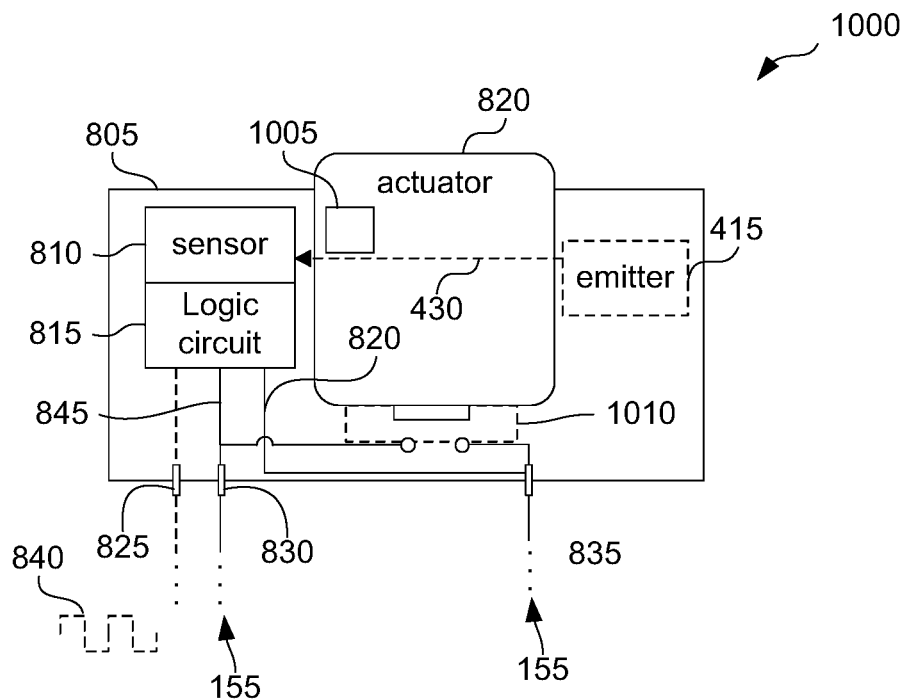
FIG. 10 is a component diagram illustrating another example of a switch assembly of the present disclosure like the assemblies shown in FIGS. 1-3, 8, and 9.
Figure 11:
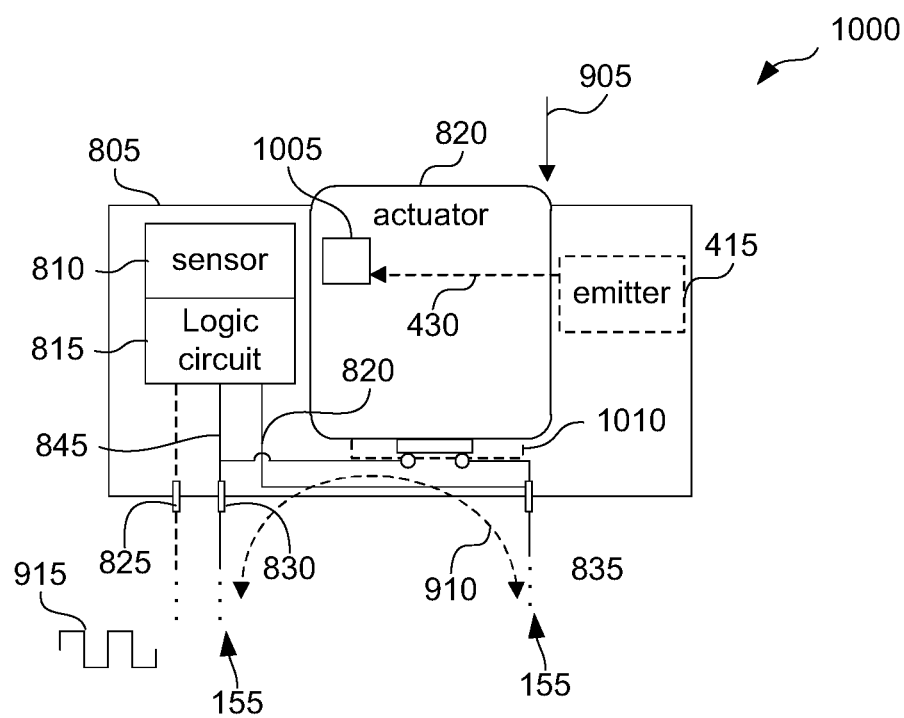
FIG. 11 is a component diagram illustrating the switch assembly of FIG. 10 in a closed position.

Illustrated at 1000 in FIGS. 10 and 11 is another example of a switch assembly according to the present disclosure illustrating an example of different sensing technologies used within a switch assembly like those shown in the preceding figures. Switch assembly 1000 includes an actuator 820 arranged and configured to move in direction of movement 905 to close electric circuit 155 when in a closed position shown in FIG. 11, and to open electric circuit 155 when in an open position as shown in FIG. 10. Switch assembly 1000 may also include a sensor 810 responsive to the position of actuator 820 which may be configured to generate a signal indicating that actuator 820 is changing, or has changed, position. Sensor 810 is thus responsive to the position of actuator 820 such that sensor 810 is arranged and configured to generate a signal when the actuator 820 is in the open position, and optionally a different signal when the actuator 820 is in the closed position. As shown in FIGS. 9 and 11, when the actuator 820 is manipulated to move in the direction of movement 905, electric circuit 155 is completed or closed allowing for current path current path 910. As disclosed herein elsewhere, logic circuit 815 is configured to evaluate whether switch assembly 800 is malfunctioning by comparing input from electric circuit 155 and input from sensor 810.

As discussed above, the switch assembly 800 may also include a logic circuit 815 configured to compare input from the sensor 810 with input from the electric circuit 155 to determine that the switch assembly is operating properly. For example, the logic circuit 815 may be configured to generate a positive or negative open switch signal 840 and/or a positive or negative closed switch signal 915. These positive or negative output signals from logic circuit 815 may be used by other circuits (e.g. optional fault detection circuit 320) to determine and indicate either that the switch assembly 800 is operating properly, or that a malfunction has occurred as disclosed herein elsewhere.

In another aspect, switch assembly 800 optionally includes a housing 805, and the actuator 820, sensor 810, and logic circuit 815 may be mounted to housing 805 thus creating a switch assembly 800 in a single "package" which may be advantageous for easy installation and maintenance. The electric circuit 155 may be electrically connected to switch assembly 800 by a power terminal 835 and a power terminal 830 thus providing the opportunity for switch assembly 800 to open or close electric circuit 155. The switch assembly 800 may also include an optional signal terminal 825 so that other diagnostic or monitoring circuits may be coupled to the output signal open switch signal 840 of switch assembly 800. Such diagnostic equipment may include, but not be limited to, the fault detection circuit 320 shown in FIG. 3. The switch assembly 800 may include an optional bias element 1010 for exerting a biasing force opposite direction of movement 905 to automatically return actuator 820 back to the open position shown in FIG. 10 when released.

In another aspect, a contactless sensor aspect is illustrated like those illustrated in FIGS. 4-6 where actuator 820 optionally includes a sensor element 1005 which may optionally extend outwardly away from actuator 820 as shown in FIGS. 4 and 5. In that case, emitter 415 may be included emitting a beam of electromagnetic energy 430 toward sensor 810. When actuator 820 is in the "open" position like what is shown in FIGS. 4 and 10, an optional signal may be generated periodically or continuously by sensor 810 indicating that the switch assembly 1000 is not being acted on to move actuator 820.

The sensor element 1005 is optionally arranged and configured to intercept electromagnetic energy 430 when in the closed position shown in FIGS. 5 and 10. When actuator 820 is moved as indicated by direction of movement 905, sensor element 1005 crosses between emitter 415 and sensor 810 thus blocking electromagnetic energy 430. The sensor 810 may optionally generate a closed switch signal 915 that is different than open switch signal 840 indicating that the switch assembly is being acted on.

As discussed with respect to FIGS. 6 and 7, sensor element 1005 may alternatively include a metallic substance, or other suitable material to allow sensor 810 to capture movement of actuator 820 without emitter 415 emitting electromagnetic energy 430. For example, sensor 810 may include an inductive position sensor, capacitive position sensor, or any combination thereof to determine the movements of actuator 820.

In another aspect, the logic circuits of the present disclosure may include other useful circuitry such as a processor, memory, or other such circuits configured to store information about the performance of the switch assembly. This information may be sent to other circuits or used for diagnostic or performance measurements.

In another aspect, the disclosed logic circuits may include "debounce" logic, and/or logic with adjustable timing parameters stored in the logic circuit so that small delays in the logic circuit can be adjusted to avoid false positive or false negative results. For example, actuating the switch assemblies of the present disclosure optionally means that two metal parts come together to close a circuit. The moving parts of the switch may initially cause contact between the contacts or other metal parts, but sometimes only briefly, followed by a second contact that may be somewhat longer, and possibly followed by additional longer contacts until the contacts finally come to rest and the circuit is fully closed. This "bounce" may be an unwanted side effect caused by the mechanical switching aspect and can occur more than 10 times per actuation, more than 100 times, or more, over a period of less than 1 ms, less than 5 ms, or more. In the present disclosure, this may result in multiple false reports provided by the disclosed logic circuits, either positive or negative, that may occur while the switch is in the process of mechanically settling down and coming to rest. Thus, the disclosed logic circuits may include "debouncing" circuitry configured to determine that the switch has finally come to rest (either open or closed), and to report only one positive or negative over all signal per attempted actuation of the switch.

In another aspect, the disclosed logic circuits may include adjustable timing parameters used to synchronize the actions taken by the actuator to close the switch with the measurements taken on electric circuit 155. For example, the disclosed logic circuits may optionally ignore voltage and current inputs for a predetermined period of time after the first contact between the metals parts of the switch is detected. In this example, the logic circuit is configured to wait for less than 1 ms, less than 5 ms, less than 100 ms, or more for the mechanical switch to come to full rest (either open or closed) before analyzing voltage or current of electric circuit 155. In another aspect, the disclosed logic circuits may be configured to accept input from a diagnostic device connected via a wireless or wired communication link. This input may be used to adjust the timing aspects of the logic circuit, or the voltage or current thresholds to enhance the accuracy of the disclosed switch assemblies and avoid false positive or negative results.

Other examples of the disclosed concepts include the following numbered examples:

Example 1

A switch assembly, comprising:
an actuator, wherein the actuator is configured to close an electric circuit when in a closed position, and to open the electric circuit when in an open positon;
a sensor responsive to the position of the actuator;
a logic circuit configured to compare input from the sensor with input from the electric circuit to determine that the switch assembly is operating properly, wherein the actuator, sensor, and logic circuit are mounted to a common housing.

Example 2

The switch assembly of Example 1, wherein the logic circuit is configured to generate a fault signal when inputs from the sensor and electric circuit do not match.

Example 3

The switch assembly of any preceding example, wherein the sensor is responsive to changes in inductance, capacitance, reluctance, or any combination thereof, caused by moving the actuator from the open to the closed position.

Example 4

The switch assembly of any preceding example, wherein the actuator includes a protrusion, and wherein the protrusion passes adjacent to the sensor when the actuator changes position.

Example 5

The switch assembly of any preceding example, wherein the protrusion is configured to interrupt a beam of electromagnetic energy when the actuator changes position, and wherein the sensor is configured to detect the interruption.

Example 7

A switch assembly, comprising:
an actuator coupled to one or more contacts, wherein the actuator is configured to move the contacts from an open position to a closed position, and wherein the contacts are electrically connected to an electric circuit and are arranged and configured to open the electric circuit in the open position, and to close the electric circuit in the closed position;
a sensor responsive to the position of the actuator;
a separate logic circuit electrically connected to the sensor and the electric circuit, the logic circuit configured compare input from the sensor indicating the position of the actuator with voltage or current of the electric circuit.

Example 8

The switch assembly of any preceding example, wherein the logic circuit sends a fault signal when inputs from the sensor and actuator do not match.

Example 9

The switch assembly of any preceding example, wherein the sensor is responsive to changes in inductance, capacitance, eddy currents, light rays, and/or reluctance caused by a change in the position of the actuator.

Example 10

The switch assembly of any preceding example, wherein the actuator, sensor, and logic circuit are mounted within a housing.

Example 11

The switch assembly of any preceding example, wherein the actuator and sensor are arranged and configured such that a single action of the actuator causes the sensor to detect movement and the circuit to be closed.

Example 12

A switch assembly, comprising:
multiple contacts configured to move between an open position and a closed position;
an actuator arranged and configured to move the contacts between the open and closed positions; a sensor responsive to the position of the actuator, wherein the multiple contacts are electrically connected to an electric circuit, and wherein the sensor is configured to send a signal indicating the closed position of the contacts when the actuator changes position; and
a logic circuit configured to compare input from the electric circuit and the sensor, wherein the logic circuit sends a fault signal to a fault detection circuit when inputs from the sensor and the electric circuit do not match.

Example 13

The switch assembly of any preceding example, wherein the sensor is responsive to changes in inductance, capacitance, eddy currents, light rays, and/or reluctance.

Example 14

The switch assembly of any preceding example, wherein the actuator, sensor, and logic circuit are mounted to a common housing that is hermetically sealed.

Example 15

The switch assembly of any preceding example, wherein the actuator and sensor are arranged and configured so that one movement of the actuator causes the sensor to detect movement, and the circuit to be closed.

Example 17

The switch assembly of any preceding example, wherein the sensor is a capacitive position sensor.

Example 18

The switch assembly of any preceding example, wherein the actuator includes a sensing element that includes a metallic substance configured to pass adjacent the sensor when the actuator is moved from the open to the closed position.

Example 19

The switch assembly of any preceding example, wherein the actuator includes a protrusion, and wherein the protrusion is configured to interrupt a beam of electromagnetic energy directed toward the sensor when the actuator changes position, and wherein the sensor is configured to detect the interruption.

Example 20

The switch assembly of any preceding example, comprising: a biasing element arranged and configured to automatically return the actuator to an open position from a closed position.

Example 21

The switch assembly of any preceding example, wherein the actuator is configured to remain in the closed position until moved to the open position.

Glossary of Definitions and Alternatives

While examples of the inventions are illustrated in the drawings and described herein, this disclosure is to be considered as illustrative and not restrictive in character. The present disclosure is exemplary in nature and all changes, equivalents, and modifications that come within the spirit of the invention are included. The detailed description is included herein to discuss aspects of the examples illustrated in the drawings for the purpose of promoting an understanding of the principles of the inventions. No limitation of the scope of the inventions is thereby intended. Any alterations and further modifications in the described examples, and any further applications of the principles described herein are contemplated as would normally occur to one skilled in the art to which the inventions relate. Some examples are disclosed in detail, however some features that may not be relevant may have been left out for the sake of clarity.

Where there are references to publications, patents, and patent applications cited herein, they are understood to be incorporated by reference as if each individual publication, patent, or patent application were specifically and individually indicated to be incorporated by reference and set forth in its entirety herein.

Singular forms "a", "an", "the", and the like include plural referents unless expressly discussed otherwise. As an illustration, references to "a device" or "the device" include one or more of such devices and equivalents thereof.

Directional terms, such as "up", "down", "top" "bottom", "fore", "aft", "lateral", "longitudinal", "radial", "circumferential", etc., are used herein solely for the convenience of the reader in order to aid in the reader's understanding of the illustrated examples. The use of these directional terms does not in any manner limit the described, illustrated, and/or claimed features to a specific direction and/or orientation.

Multiple related items illustrated in the drawings with the same part number which are differentiated by a letter for separate individual instances, may be referred to generally by a distinguishable portion of the full name, and/or by the number alone. For example, if multiple "laterally extending elements" 90A, 90B, 90C, and 90D are illustrated in the drawings, the disclosure may refer to these as "laterally extending elements 90A-90D," or as "laterally extending elements 90," or by a distinguishable portion of the full name such as "elements 90".

The language used in the disclosure are presumed to have only their plain and ordinary meaning, except as explicitly defined below. The words used in the definitions included herein are to only have their plain and ordinary meaning. Such plain and ordinary meaning is inclusive of all consistent dictionary definitions from the most recently published Webster's and Random House dictionaries. As used herein, the following definitions apply to the following terms or to common variations thereof (e.g., singular/plural forms, past/present tenses, etc.):

"Contactless position sensor" generally refers to a sensor configured to detect the position or movement of an object without direct physical contact with the object (either directly, or indirectly through interim contact with other objects).

"Actuator" generally refers to a device that moves in order to control the operation of another device. An actuator may be one of and/or a combination of many types. For example, an actuator may be mechanical, electrical, pneumatic, and/or hydraulic.

"Bias Element" generally refers to an elastic object that may be moved from a position of equilibrium, and that upon doing so, is configured to rely on the elasticity of the object to exert a biasing force opposite the direction of movement so as to urge the object back into the equilibrium position. On example of a bias element is a spring which can be pressed, pulled, and/or twisted but returns to its former shape when released. In another example, a bulged metallic, plastic, or rubber plate may be a biasing element, such as in the case of a soft tactile push button switch. In another example, elastic rubber or fabric strands woven in cloth may operate as a biasing element. The biasing element can be made from any suitable resilient or elastic material such as metal and/or plastic that can counter or resist loads and apply force at constant or variable levels.

"Capacitive Displacement Sensor" generally refers to devices capable of measurement of the thickness, position, and/or change of position of a target. Such sensors may be non-contact devices capable of high-resolution measurement, such as detecting the position, movement, or thickness of the target down to the nanometer level.

"Contact" generally refers to a portion of an electric circuit arranged and configured to pass an electrical current when touching another electrically conductive portion of the circuit. For example, contacts may be used in relays, switches, connectors, and/or circuit breakers to physically complete an electric circuit. Contacts are said to be closed when they are touching and are said to be open when they are separated. When closed, contacts allow the flow of electrical current. When open, contacts are separated by a gap that includes an insulative material or gas thus obstructing the flow of current. Contacts are typically metallic, such as copper or gold, to allow current flow. However, contacts may also be made of a semi conductive material such as silicon or germanium. Additionally, contacts may be made of a nonmetallic conductive material such as graphite.

"Control Logic" generally refers to hardware or software configured to implement an automatic decision making process by which inputs are considered, and corresponding outputs are generated. The output may be used for any suitable purpose such as to provide specific commands to machines or processes specifying specific actions to take. Examples of control logic include computer programs executed by a processor to accept commands from a user and generate output according to the logic implemented in the program as executed by the processor.

In another example, control logic may be implemented as a series of logic gates, microcontrollers, and the like, electrically connected together in a predetermined arrangement so as to accept input from other circuits or computers and produce an output according to the rules implemented in the logic circuits.

"Controller" generally refers to a mechanical or electronic device configured to control the behavior of another mechanical or electronic device. A controller may include a "control circuit" configured to provide signals or other electrical impulses that may be received and interpreted by the controlled device to indicate how it should behave.

"Electric Circuit" generally refers to the path followed by electrons from a generation source, through an electrical system, and returning to the source. An electric circuit may be open or closed. When an electric circuit is open, there is a break in the continuity of the circuit. As a result, the electrons are unable to flow. For example, when the wires of a circuit are disconnected the circuit is said to be open. When an electric circuit is closed, there is no break in the continuity of the circuit. As a result, the electrons are able to flow. For example, when the wires of a circuit are properly connected, with no breaks, the circuit is said to be closed.

"Electrically Connected" generally refers to a configuration of two objects that allows electricity to flow between them or through them. In one example, two conductive materials are physically adjacent one another and are sufficiently close together so that electricity can pass between them. In another example, two conductive materials are in physical contact allowing electricity to flow between them.

"Electromagnetic Energy" generally refers to a form of energy that can be reflected or emitted from objects through electrical or magnetic waves traveling through matter, through space, or any combination thereof. Electromagnetic energy comes in many examples including, but not limited to, gamma rays, X-rays, ultraviolet radiation, visible light, microwaves, radio waves and infrared radiation.

"Fault Detection Circuit" generally refers to a circuit configured to detect fault conditions which are unusual conditions in components connected to a circuit thus providing the ability for the circuit to determine the source of the unusual condition. For example, an outage detection circuit may be configured to detect faults in a switch or contactor such as by receiving input indicating that the switch should be closed and is not, or should be open and is not. In another example, a fault detection circuit may receive input indicating that an electronic component such as a logic circuit, LED indicator, sensor, emitter, and the like has failed.

"Inductive Position Sensor" generally refers to a device that uses electromagnetic induction to detect the position, movement, or dimensions of objects. For example, the sensor may drive a coil with an oscillator so that as a metallic object approaches the coil, the inductance of the coil is altered producing a change in frequency or a change in the current in the coil. These changes can be detected, amplified, compared to a threshold and use to provide an output signal which may be used as input to another circuit. In one example, the coil may have a ferromagnetic core to make the magnetic field more intense and to increase the sensitivity of the device. In another example, a coil without a ferromagnetic core (i.e. an "air core") may also be used. In another example, the sensor may use one coil to produce a changing magnetic field, and a second coil (or other device) to sense the changes in the magnetic field produced by an object, for example, due to eddy currents induced in a metal object.

"Lead" generally refers to an electrical conductor physically coupling and electrically connecting two other electrical conductors. Examples of a lead include traces between electrical components on a Printed Circuit Board (PCB), or wires electrically connecting to portions of an electrical circuit. A bundle of wires electrically connection multiple circuits together may be thought of as a single lead, or as multiple separate leads.

"Logic Circuit" generally refers to a circuit that takes input from one or more sources and provides output based on logical rules and/or inferences implemented in the circuit. These logical rules may be implemented using any suitable logic circuit such as by different arrangements of logic gates (e.g. AND, OR, NOT, XOR, etc.), rules implemented in software and executed by a processor or microcontroller, and the like.

"Multiple" is generally synonymous with the term "plurality" and refers to more than one, or by extension, two or more.

"Optionally" means discretionary; not required; possible, but not compulsory; left to personal choice.

"Sense Parameter" generally refers to a property of the environment detectable by a sensor. As used herein, sense parameter can be synonymous with an operating condition, environmental factor, sensor parameter, or environmental condition. Sense parameters may include temperature, air pressure, speed, acceleration, the presence or intensity of sound or light or other electromagnetic phenomenon, the strength and/or orientation of a magnetic or electrical field, and the like.

"Sensor" generally refers to a transducer configured to sense or detect a characteristic of the environment local to the sensor. For example, sensors may be constructed to detect events or changes in quantities or sensed parameters providing a corresponding output, generally as an electrical or electromagnetic signal. A sensor's sensitivity indicates how much the sensor's output changes when the input quantity being measured changes.

"Signal" generally refers to a detectable physical quantity or impulse (such as a voltage, current, or magnetic field strength) by which messages or information can be transmitted. This includes any time varying voltage, current or electromagnetic wave that carries information.

The concept also includes any observable change in a monitored entity, such as in the case of watching for signal in the form of a raised flag or a launched flare, or continuously evaluating a location in a computer memory and reacting differently depending on the values stored there over time, or monitoring radio waves on a predetermined frequency for a predetermined pattern of analog or digital variations. Any physical quantity that exhibits variation in space or time can be a signal used, among other possibilities, to share messages between observers, transmitters, or receivers. Examples include audio, video, speech, image, sonar and radar-related time varying aspects.

A signal may or may not contain any intrinsic information, such as in the case where random variations (i.e. "noise") may be observed but may itself be accepted as a transmission of information. For example, not receiving an expected series of variations (i.e. an intended signal), and receiving instead only random noise may be taken to mean that the expected transmitter is malfunctioning, or is otherwise offline.

"Switch Assembly" generally refers to a collection of components operating together to function as a switch. These components may be grouped together in a common housing, or may be positioned apart from one another in separate locations.

"Terminal" means a plug, socket or other connection (male, female, mixed, hermaphroditic, or otherwise) for mechanically and electrically connecting two or more wires or other conductors.

What is claimed is:

1. A switch assembly, comprising:
   an actuator, wherein the actuator is configured to close an electric circuit when in a closed position, and to open the electric circuit when in an open position;
   a sensor responsive to the position of the actuator; and
   a logic circuit configured to compare input from the sensor with input from the electric circuit to determine that the switch assembly is operating properly, wherein the actuator, sensor, and logic circuit are mounted to a common housing;
   wherein the sensor is a capacitive displacement sensor, and
   wherein the actuator includes a sensing element that includes a metallic substance configured to pass adjacent the sensor when the actuator is moved from the open to the closed position.

2. The switch assembly of claim 1, wherein the logic circuit is configured to generate a fault signal when inputs from the sensor and electric circuit do not match.

3. The switch assembly of claim 1, wherein the actuator includes a protrusion, and wherein the protrusion passes adjacent to the sensor when the actuator changes position.

4. The switch assembly of claim 3, wherein the protrusion is configured to interrupt a beam of electromagnetic energy when the actuator changes position, and wherein the sensor is configured to detect the interruption.

5. A switch assembly, comprising:
   an actuator coupled to one or more contacts, wherein the actuator is configured to move the contacts from an open position to a closed position, and wherein the contacts are electrically connected to an electric circuit and are arranged and configured to open the electric circuit in the open position, and to close the electric circuit in the closed position;
   a sensor responsive to the position of the actuator; and
   a separate logic circuit electrically connected to the sensor and the electric circuit, the logic circuit configured compare input from the sensor indicating the position of the actuator with voltage or current of the electric circuit;
   wherein the sensor is a capacitive displacement sensor, and
   wherein the actuator includes a sensing element that includes a metallic substance configured to pass adjacent the sensor when the actuator is moved from the open to the closed position.

6. The switch assembly of claim 5, wherein the logic circuit sends a fault signal when inputs from the sensor and actuator do not match.

7. The switch assembly of claim 5, wherein the actuator, sensor, and logic circuit are mounted within a housing.

8. The switch assembly of claim 5, wherein the actuator and sensor are arranged and configured such that a single action of the actuator causes the sensor to detect movement and the circuit to be closed.

9. A switch assembly, comprising:
   multiple contacts configured to move between an open position and a closed position;
   an actuator arranged and configured to move the contacts between the open and closed positions;
   a sensor responsive to the position of the actuator, wherein the sensor is configured to send a signal indicating the closed position of the contacts when the actuator changes position; and
   a logic circuit configured to compare input from an electric circuit and the sensor, wherein the multiple contacts are electrically connected to an electric circuit, and wherein the logic circuit sends a fault signal to a fault detection circuit when inputs from the sensor and the electric circuit do not match, wherein the sensor is a capacitive displacement sensor; and wherein the actuator includes a sensing element that includes a metallic substance configured to pass adjacent the sensor when the actuator is moved from the open to the closed position.

10. The switch assembly of claim 9, wherein the sensor is responsive to changes in inductance, capacitance, eddy currents, light rays, and/or reluctance.

11. The switch assembly of claim 9, wherein the actuator, sensor, and logic circuit are mounted to a common housing that is hermetically sealed.

12. The switch assembly of claim 9, wherein the actuator and sensor are arranged and configured so that one movement of the actuator causes the sensor to detect movement, and the circuit to be closed.

13. The switch assembly of claim 9, wherein the actuator includes a protrusion, and wherein the protrusion is configured to interrupt a beam of electromagnetic energy directed toward the sensor when the actuator changes position, and wherein the sensor is configured to detect the interruption.

14. The switch assembly of claim 9, comprising:

a biasing element arranged and configured to automatically return the actuator to an open position from a closed position.

15. The switch assembly of claim 9, wherein the actuator is configured to remain in the closed position until moved to the open position.

* * * * *